United States Patent
Casset

(10) Patent No.: US 9,612,040 B2
(45) Date of Patent: Apr. 4, 2017

(54) DEVICE AND METHOD FOR GENERATING A SECOND TEMPERATURE VARIATION FROM A FIRST TEMPERATURE VARIATION

(71) Applicant: Commissariat à l'énergie atomique et aux énergies alternatives, Paris (FR)

(72) Inventor: Fabrice Casset, Tencin (FR)

(73) Assignee: Commissariat À L'Énergie Atomique Et Aux Énergies Alternatives, Paris (FR)

(*) Notice: Subject to any disclaimer, the term of this patent is extended or adjusted under 35 U.S.C. 154(b) by 492 days.

(21) Appl. No.: 14/362,285

(22) PCT Filed: Nov. 29, 2012

(86) PCT No.: PCT/EP2012/073968
§ 371 (c)(1),
(2) Date: Jun. 2, 2014

(87) PCT Pub. No.: WO2013/079596
PCT Pub. Date: Jun. 6, 2013

(65) Prior Publication Data
US 2014/0295365 A1    Oct. 2, 2014

(30) Foreign Application Priority Data
Dec. 2, 2011 (FR) .................................... 11 61067

(51) Int. Cl.
*F24J 3/00* (2006.01)
*F03G 7/06* (2006.01)
(Continued)

(52) U.S. Cl.
CPC ................ *F24J 3/00* (2013.01); *B81B 3/0024* (2013.01); *B81B 3/0081* (2013.01); *F03G 7/06* (2013.01);
(Continued)

(58) Field of Classification Search
CPC ........ B81B 3/0024; B81B 3/0081; F03G 7/06; H02N 2/18; H02N 2/186
(Continued)

(56) References Cited

U.S. PATENT DOCUMENTS

| 6,367,281 B1 | 4/2002 | Hugenroth |
| 2003/0006668 A1* | 1/2003 | Lal .......................... G21H 1/00 310/301 |

(Continued)

OTHER PUBLICATIONS

Emmanuel Defay, "*Integration of ferroelectric and piezoelectric thin films*", Wiley, 2011.
(Continued)

*Primary Examiner* — Shawki S Ismail
*Assistant Examiner* — Bryan Gordon
(74) *Attorney, Agent, or Firm* — Occhiuti & Rohlicek LLP

(57) ABSTRACT

A device for generating a second temperature variation $\Delta T_2$ from a first use temperature variation $\Delta T_1$, includes an elastocaloric material layer, having an internal temperature which is able to vary by $\Delta T_2$ in response to a given mechanical stress variation $\Delta\sigma$ applied to the elastocaloric material layer. The variation $\Delta\sigma$ being induced by the first use temperature variation $\Delta T_1$ There is a suspended element in mechanical contact with the elastocaloric material layer so as to apply to this layer a mechanical stress that varies in response to the use temperature variation $\Delta T_1$. The suspended element is arranged so as to make the mechanical stress applied to the elastocaloric material layer vary by $\Delta\sigma$ in response to the temperature variation $\Delta T_1$, to generate the second temperature variation $\Delta T_2$.

17 Claims, 3 Drawing Sheets

(51) Int. Cl.
  *B81B 3/00*  (2006.01)
  *H02N 2/18*  (2006.01)
  *H01L 41/113*  (2006.01)

(52) U.S. Cl.
  CPC ........ *H02N 2/18* (2013.01); *B81B 2201/0271* (2013.01); *B81B 2201/031* (2013.01); *B81B 2201/032* (2013.01); *H01L 41/1136* (2013.01)

(58) Field of Classification Search
  USPC .......................................... 310/306, 307, 339
  See application file for complete search history.

(56) References Cited

U.S. PATENT DOCUMENTS

| | | |
|---|---|---|
| 2005/0205125 A1 | 9/2005 | Nersessian et al. |
| 2007/0063613 A1 | 3/2007 | Elata et al. |
| 2009/0241537 A1 | 10/2009 | Browne et al. |
| 2009/0315335 A1 | 12/2009 | Ujihara et al. |
| 2009/0322184 A1 | 12/2009 | Carman et al. |
| 2010/0164331 A1 | 7/2010 | Yamada |
| 2011/0006639 A1* | 1/2011 | Kashiwaya ........... C04B 35/493 310/323.02 |
| 2011/0193449 A1 | 8/2011 | Phan et al. |
| 2011/0215590 A1 | 9/2011 | Arnold et al. |
| 2012/0188539 A1* | 7/2012 | Stuke .................... G01N 21/658 356/301 |
| 2012/0247706 A1* | 10/2012 | Cui ......................... F25B 23/00 165/10 |
| 2012/0256427 A1* | 10/2012 | Mitchell ................. H02N 2/18 290/1 R |

OTHER PUBLICATIONS

Bonnot et al. "Electrocaloric Effect Associated with the Martensitic Transition in Shape-Memory Alloys," Physical Review Letters, 100:125901-1-4 (2008).

Epstein, Richard I. and Kevin J. Malloy, "Electrocaloric Devices Based on Thin-Film Heat Switches," J. Appl. Phys. 106 16 pages, 2009.

Lloveras et al., "Thermodynamics of stress-induced ferroelastic transitions: Influence of anisotropy and disorder," Physical Review B 81, 214105 91-8) (2010).

Namli et al., Modeling of piezo-SMA composites for thermal energy harvester, (Abstract) http://spiedigitallibrary.org/proceedings/resource/2/psisdg/6526/1/65261L_1?isAuthorized=no (2007).

* cited by examiner

DEVICE AND METHOD FOR GENERATING A SECOND TEMPERATURE VARIATION FROM A FIRST TEMPERATURE VARIATION

RELATED APPLICATIONS

Under 35 USC 371, this application is the national stage of PCT/EP2012/073968, filed on Nov. 29, 2012, which claims the benefit of the Dec. 2, 2011 filing date of French application FR1161067, the contents of which are herein incorporated by reference.

FIELD OF INVENTION

The invention relates to a device and method for generating a second temperature variation $\Delta T_2$ from a first temperature variation $\Delta T_1$.

BACKGROUND

Devices for generating a second temperature variation from a first temperature variation have a great many applications. For example, these devices prove to be useful:

- for increasing the efficiency of devices that generate electricity from a temperature variation,
- for cancelling or limiting the harmful effects of the temperature variation $\Delta T_1$ by generating a temperature variation $\Delta T_2$ of opposite direction, or
- for amplifying the temperature variation $\Delta T_1$.

Prior art is known from: US2005/205125A1, US2011/193449A1, US2010/164331A1, U.S. Pat. No. 6,367,281B1, US2009/322184A1, US2007/063613A1, US2011/215590A1, US2003/006668A1, US2009/315335A1.

SUMMARY

The aim of the invention is to propose a simple device for generating the temperature variation $\Delta T_2$ from the temperature variation $\Delta T_1$. Its subject is therefore such a device in accordance with claim 1.

The use of a suspended element capable of making the stress applied to the elastocaloric material layer vary by at least $\Delta\sigma$ MPa in response to the temperature variation $\Delta T_1$, makes it possible to generate the temperature variation $\Delta T_2$ simply from the temperature variation $\Delta T_1$.

In the remainder of this description the term "stress" designates a mechanical stress.

The embodiments of this device can include one or more of the features of the dependent claims.

These embodiments of the device furthermore have the following advantages:

- associating the suspended element with a transducer able to convert the deformations of the suspended element into electrical energy makes it possible to obtain an efficient device for generating electricity from a temperature gradient;
- the production of the suspended element in the form of a bimetallic strip makes it possible to simply transform the temperature variation $\Delta T_1$ into a variation of the mechanical stress applied to the elastocaloric material layer greater than $\Delta\sigma$;
- using the elastocaloric material layer to form one of the layers of the bimetallic strip simplifies the fabrication of this device;
- associating the elastocaloric material layer with an oscillating suspended element makes it possible to limit the variation in frequency of this oscillating element in response to the temperature variation $\Delta T_1$ and therefore to decrease the sensitivity of the oscillation frequency with respect to such temperature variations;
- choosing an elastocaloric material that generates a temperature variation $\Delta T_2$ of opposite direction and of amplitude substantially equal to the temperature variation $\Delta T_1$ makes it possible to reduce the sensitivity of the oscillation frequency of the suspended element to the variation $\Delta T_1$ in the ambient or use temperature;
- using materials having different thermal expansion coefficients to produce the suspended element and the rigid substrate to which it is fastened, or the suspended element and the elastocaloric material, makes it possible to easily generate the stress in the elastocaloric material layer suitable for generating the temperature variation $\Delta T_2$;
- the presence of the elastocaloric material layer interposed between the suspended element and the substrate makes it possible to simply exert large stresses on this layer in the case of a variation $\Delta T_1$ in the ambient temperature;
- choosing an elastocaloric material that generates a temperature variation $\Delta T_2$ of same direction as the temperature variation $\Delta T_1$ makes it possible to amplify the temperature variation and therefore to generate more heat.

Another subject of the invention is a method for generating a second temperature variation from a first use temperature variation in accordance with claim 15.

The embodiments of the method can include the feature of claim 16.

The invention will be better understood upon reading the following description, given solely by way of non-limiting example.

BRIEF DESCRIPTION OF DRAWINGS

In these figures, the same references are used to designate the same elements.

DETAILED DESCRIPTION

In the remainder of this description, the features and functions well known to those skilled in the art are not described in detail.

Figure 1:
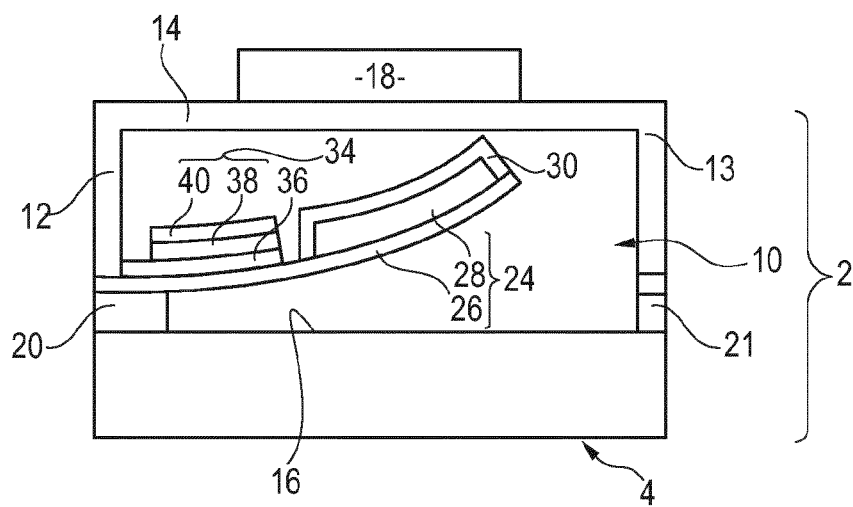
FIGS. 1 and 2 are schematic illustrations of a device for generating electricity from a temperature variation, respectively, in two different positions.

FIG. 1 represents a device 2 for generating electricity from a temperature gradient. To do so, this device notably generates a second temperature variation $\Delta T_2$ from a first temperature variation $\Delta T_1$. Here, the device 2 is a MEMS (Micro Electro-Mechanical System). This device 2 is therefore fabricated using the same fabrication methods as those used to fabricate microelectronics components. Typically, it is fabricated by deposition and etching of successive layers, one on top of the other. Here, these layers are deposited on a substrate 4 which runs essentially horizontally. The substrate 4 is for example a silicon substrate several tens of micrometers thick. The largest horizontal width of the device 2 is therefore here typically below 1 cm or even below 5 mm. Its height, in the vertical direction is typically below 5 mm or even below 1 mm.

The device 2 includes a recess 10 delimited by vertical walls 12 and 13, an upper horizontal wall 14 and a lower horizontal wall 16. Here, the wall 16 is composed of the substrate 4.

The walls 14 and 16 are also called hot and cold walls, respectively, in the following text. Indeed, these walls are intended to be heated to temperatures, $T_c$ and $T_f$ respectively, where the temperature $T_c$ is strictly greater than the temperature $T_f$ so as to create a vertical temperature gradient. Typically, during operation of the device 2, the separation between the temperatures $T_c$ and $T_f$ is greater than 10° C. and, preferably, greater than 30° C. or 50° C. With this aim, the wall 14 is directly in contact with a heat source 18.

For example, the source 18 can be an integrated circuit capable of executing arithmetic operations such as a microprocessor. The source 18 can also be formed by channels in which a heat conducting fluid flows that is hotter than the ambient temperature. In the case of channels, the latter are preferably housed inside the wall 14 itself.

Here, the bulk of the walls 12 and 13 and of the wall 14 are formed by the walls of a hood attached to a hollow housing defined in the substrate 4 in order to form the recess 10. The hollow housing is delimited on its vertical sides by shims 20, 21, made of oxide for example, and by the wall 16.

An element 24 suspended above the substrate 4 is housed inside the recess 10. Here, this element 24 is a cantilever that extends between one end or proximal edge and another end or distal edge. The proximal end is anchored with no degree of freedom in the wall 12. The distal end is free to move vertically inside the recess 10. The length of this cantilever is typically between 50 μm and 1 mm. Its width lies between 1 μm and 100 μm.

Figure 2:
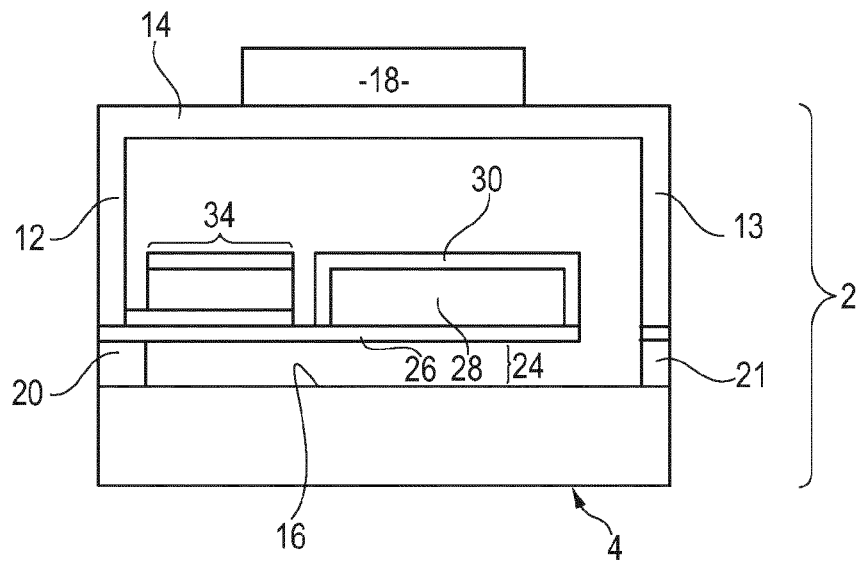

The element 24 is capable of deforming between a top position, represented in FIG. 1, and a bottom position, represented in FIG. 2 in response to the variation $\Delta T_1$ in a temperature of use of the device 2. In the top position, the element 24 is closer to the wall 14 than in its bottom position. Conversely, in the bottom position, the element 24 is closer to the wall 16 than in its top position.

To move between top and bottom positions, the element 24 is formed:
of a lower layer 26 made of a material having a thermal expansion coefficient $\delta_1$ and
of an upper layer 28 made of a material having a thermal expansion coefficient $\delta_2$.

The layers 26 and 28 extend essentially from the proximal end to the distal end. They are fastened one on top of the other with no degree of freedom so as to form a bimetallic strip. Here, the layer 28 is pre-stressed so that the element 24 is in its top position when the source 18 does not heat.

In this embodiment, the coefficient $\delta_2$ is greater than the coefficient $\delta_1$ so that under the effect of an increase in temperature, the element 24 deforms from its top position to its bottom position.

An elastocaloric material layer 30 is arranged directly on the element 24. An elastocaloric material is a material that transforms a variation in mechanical stress into a variation of its internal temperature. Here, a material is considered to be "elastocaloric" when it has the ability to vary its internal temperature by at least 1° C. and, preferably, by at least 5 or 10° C. in response to a given variation $\Delta\sigma$ of the stress applied to this material. For the property of the elastocaloric material to be non-negligible, it is generally necessary for the given variation $\Delta\sigma$ to be less than 2 GPa or 5 GPa or 10 GPa. Furthermore, typically, the given variation $\Delta\sigma$ is often greater than 1 or 10 MPa, or even 1 GPa. Many elastocaloric materials exist. For example, the following materials are elastocaloric materials: nickel and titanium alloys (NiTi), FeRh alloys, ferroelectric polymers, $Cu_{68.13}Zn_{15.74}Al_{16.13}$ and PZT (Lead Zirconate Titanate). The elastocaloric properties of these materials often stem from the fact that they can have two crystallographic phases, called martensitic phase and austenitic phase respectively by analogy with steels, and have the ability to pass reversibly from one of these phases to the other when they undergo a variation in stress. Passing from one of these phases to the other translates into a change in the internal temperature of the elastocaloric material.

For example, a study of the elastocaloric properties of $Cu_{68.13}Zn_{15.74}Al_{16.13}$ may be consulted in the following article:

E. Bonnot, R. Romero, L. Manosa, E. Vives and A. Planes, *"Elastocaloric effect associated with martensitic transition in shape-memory alloys"*, PRL 100,125901, of 28 Mar. 2008.

In particular, the graph in FIG. 1 of this article indicates that a variation of 35 MPa in the mechanical stress applied to the $Cu_{68.13}Zn_{15.74}Al_{16.13}$ makes it possible to obtain a variation in its temperature of over 15° C. Similar studies applied to the other elastocaloric materials mentioned here make it possible to obtain, for each of them, the value of the given stress variation $\Delta\sigma$ that makes it possible to obtain a desired variation $\Delta T_2$ in the internal temperature of this material. These studies also make it possible to determine whether the internal temperature increases when the mechanical stress increases, or the reverse. Indeed, elastocaloric materials also exist whose temperature decreases when the applied mechanical stress increases.

The layer 30 is fastened with no degree of freedom onto the element 24 to:
undergo the stress variation caused by the deformation of this element between the top and bottom positions, and
exchange heat with this element 24 by thermal conduction.

For example, the layer 30 runs essentially along one of the layers 26 or 28 of the element 24. Here, it runs essentially directly over the layer 28.

In this embodiment, the elastocaloric material of the layer 30 is chosen to provoke a drop in its temperature when the element 24 deforms from its top position to its bottom position. During this deformation, the mechanical stress undergone by the layer 30 decreases. Typically, the stress varies by at least 10 MPa and generally by over 100 MPa or 1 GPa. The chosen elastocaloric material transforms this stress variation into a drop in its internal temperature.

For example, the material used to produce the layer 30 is $Cu_{68.13}Zn_{15.74}Al_{16.13}$. In the remainder of this description, it is supposed that the desired variation $\Delta T_2$ is of about 10°. Note that for this material, this desired variation $\Delta T_2$ corresponds to a given stress variation $\Delta\sigma$ of about 27 MPa according to studies carried out on this material.

Here, the element 24 is arranged to generate this given stress variation $\Delta\sigma$ (27 MPa) in the layer 30 in response to the temperature variation $\Delta T_1$. In this embodiment, the variation $\Delta T_1$ is a temperature variation of at least one of the walls 14 and 16. By way of example, it is the temperature of the wall 14 that varies. This variation is caused by the heat source 18. The amplitude of the variations is greater than 10° C. and preferably greater than 50° C. This corresponds for example to the source 18 passing from an inactive state to an active state. In the remainder of this description, by way of illustration, it is supposed that the variation $\Delta T_1$ is of 50° C.

In response to this variation $\Delta T_1$, the element 24 moves between its top and bottom positions. During its movements, its temperature increases when it approaches the wall 14 and, conversely, decreases when it approaches the wall 16. The amplitude of the temperature variation undergone by the element 24 can be estimated from the knowledge of the thermal characteristics of the source 18 and the device 2. For example, here, it is considered that the temperature of the element 24 varies by over 10° C. and, for example, by more than 45° C. between its top position and its bottom position.

Typically, the dimensions of the element 24 and the materials of the layers 26 and 28 making it possible to obtain the given variation $\Delta\sigma$ in the stress applied to the layer 30 in response to the temperature variation $\Delta T_1$ are determined experimentally. For example, to do so, numerical simulations of the deformations of the element 24 for various dimensions and various materials are carried out using simulation software packages such as finite element simulation software packages. For example, the following table gives a few results for various arrangements of the element 24 obtained by numerical simulation, setting $\Delta T_1$ equal to 50° C.

| Number of the arrangement | Arrangement of the element 24 (L = Length, l = width, e = thickness; these dimensions are expressed in μm) | Stress $\Delta\sigma$ generated in MPa |
|---|---|---|
| 1 | Layer 28 of Aluminum (L = 80, l = 8, e = 0.1) Layer 26 of Silicon (L = 200, l = 10, e = 1) | 40 |
| 2 | Layer 28 of SiO$_2$ (L = 80, l = 8, e = 0.1) Layer 26 of Silicon (L = 200, l = 10, e = 1) | 20 |
| 3 | Layer 28 of SiO$_2$ (L = 100, l = 8, e = 0.1) Layer 26 of Silicon (L = 200, l = 10, e = 1) | 27 |
| 4 | Layer 28 of SiO$_2$ (L = 110, l = 8, e = 0.1) Layer 26 of Silicon (L = 200, l = 10, e = 1) | 18 |

According to this table, the arrangements n° 1 and 3 of the element 24 make it possible to apply to the layer 30 the stress variation necessary to make its temperature vary ($\Delta T_2$) by at least 10° C. when the variation $\Delta T_1$ is of 50° C.

Here, the layers 26 and 28 are not made of an elastocaloric material.

Finally, the device 2 also includes a transducer 34 capable of transforming the deformations of the element 24 into electrical energy. Here, the transducer 34 is a piezoelectric component fastened with no degree of freedom onto the element 24 to transform the stress variation caused by its deformations into electrical energy. For example, the transducer 34 comprises:
- a conducting electrode 36 deposited directly onto the layer 28,
- a layer 38 of piezoelectric material deposited directly onto the electrode 36, and
- a conducting electrode 40 deposited directly onto the layer 38.

To simplify the illustration, the electrical connections of the electrodes 36 and 40 with connecting pads outside the recess 10 have not been represented.

Figure 3:
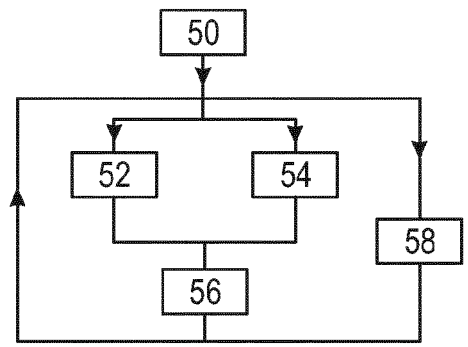
FIG. 3 is a method for generating electricity using the device in FIGS. 1 and 2.

The operation of the device 2 will now be described in more detail with reference to the method in FIG. 3.

In the absence of thermal gradient between the walls 14 and 16 and for an ambient air temperature of 20° C., the element 24 is in its top position.

In a step 50, the source 18 is activated and begins to heat the wall 14 whereas the wall 16 is in contact with the ambient air. The activation of the source 18 triggers the variation $\Delta T_1$ in the temperature of the wall 14. This also triggers the appearance of a temperature gradient between the walls 14 and 16. Typically, this temperature gradient is greater than 30° and, here, greater than 50° C.

In response, in a step 52, the element 24, which is in its top position, heats up by $\Delta T_1$. Under the action of this increase in its internal temperature, it deforms from its top position to its bottom position because of the differential expansion of its component materials. During its movement, to the bottom position, its temperature decreases because it moves further away from the hot wall 14 and approaches the cold wall 16. The movement of the distal end during this step can be computed in the case of a cantilever. For example, for such a computation, one may refer to the following book: Emmanuel Defay, "Integration of ferroelectric and piezoelectric thin films", Wiley, 2011

In parallel, in a step 54, during the deformation of the element 24 from its top position to its bottom position, the stress exerted on the layer 30 decreases by $\Delta\sigma$. In response, the temperature of the elastocaloric material of the layer 30 decreases also and therefore produces a variation $\Delta T_2$ in its internal temperature. This variation $\Delta T_2$ accelerates and increases the cooling of the element 24 by thermal conduction between the layer 30 and the layers 26 and 28. This variation in the internal temperature of the elastocaloric element $\Delta T_2$ therefore opposes the variation $\Delta T_1$ initially undergone by the element 24.

In a step 56, under the joint action of the cooling caused by its receding from the wall 14 and by the drop $\Delta T_2$ in the temperature of the layer 30, the element 24 deforms again to return to its top position. Steps 52 to 56 are reiterated in a loop so that the element 24 oscillates when a temperature gradient is applied between the walls 14 and 16. These oscillations can either be maintained or dampened. When these oscillations are dampened, if the temperature gradient is maintained constant indefinitely, the element 24 tends to stop moving after a certain number of oscillations at an equilibrium position halfway between its top and bottom positions.

In parallel with steps 52 to 56, in a step 58 the transducer 34 transforms the mechanical deformations of the element 24 into electrical energy. The electrical energy thus produced can then be used to power an electrical appliance.

Figure 4:
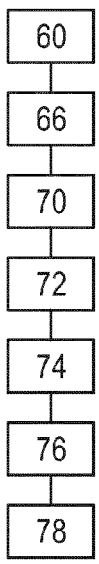
FIG. 4 is a flow chart of a method for fabricating the device in FIGS. 1 and 2.
Figure 5:
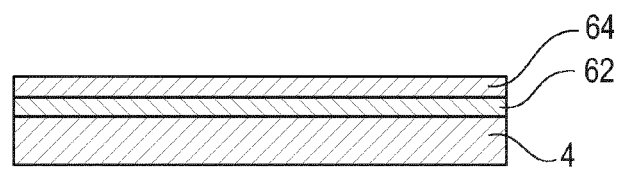
FIGS. 5 to 10 are schematic and cross section illustrations of various steps of fabrication of the device in FIGS. 1 and 2.
Figure 6:
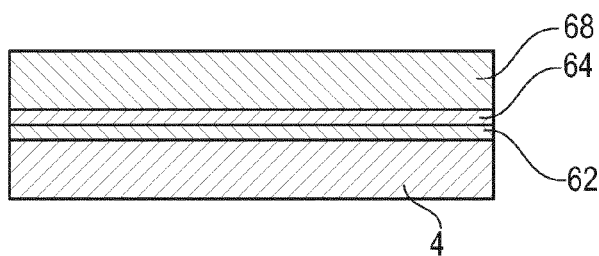

An example of a method for fabricating the device 2 will now be described, with reference to the method in FIG. 4 and to the various illustrations in the FIGS. 5 to 10.

The method begins with a step 60 of provision of a SOI (Silicon On Insulator) substrate. This substrate is represented in FIG. 15. It is essentially composed, going from bottom to top, of a layer of silicon corresponding to the substrate 4 of the device 2, of a layer of oxide 62 and of a thin film of silicon 64. The oxide layer 62 is for example made of silicon oxide.

Next, in a step 66, a pre-stressed oxide layer 68 is deposited on the silicon layer 64. The stress exerted by the layer 68 is calibrated so that at ambient temperature, for example 20° C., the element 24 is in its top position. The stress in the layer 68 can be adjusted by altering its temperature or its deposition speed for example. The thickness of the layer 68 is typically between 100 nm and 50 μm and, preferably, between 200 nm and 10 or 30 μm. The layer 68 is for example made of silicon oxide or silicon nitride.

Figure 7:
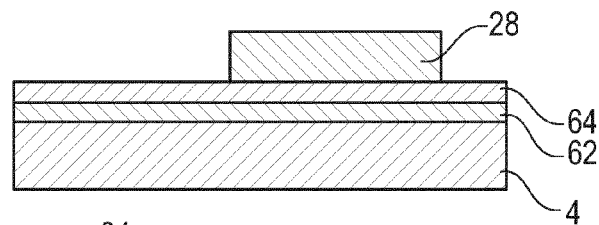

In a step 70, the layer 68 is etched to form the layer 28 of the element 24 (see FIG. 7).

Figure 8:
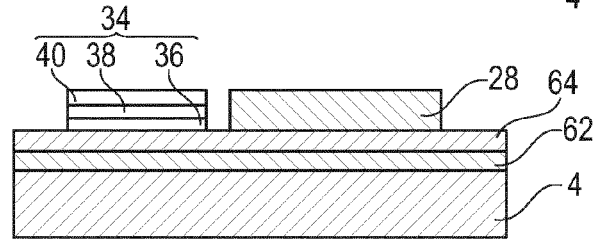
Figure 9:
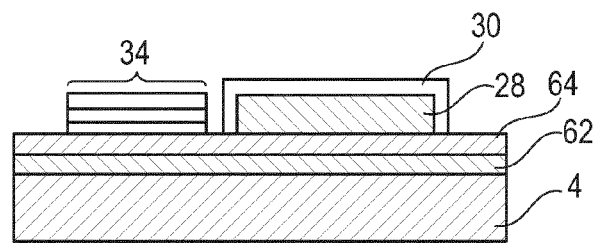

In a step 72, the transducer 34 is produced on the layer 64 beside the layer 28 (see FIG. 8). In this step 72, the electrodes 36 and 40 as well as the piezoelectric layer 38 are deposited and etched so as to obtain the transducer 34. For example:
- the layer 36 is a layer of platinum 100 nm in thickness,
- the layer 40 is a layer of ruthenium 100 nm in thickness,
- the layer 38 is a layer of aluminum nitride with a thickness of between 100 nm and 2.5 µm.

In a step 74, an elastocaloric material layer is deposited and etched on the layer 28 so as to form the layer 30. The thickness of the elastocaloric material layer is for example between 100 nm and 10 µm (see FIG. 9).

Figure 10:
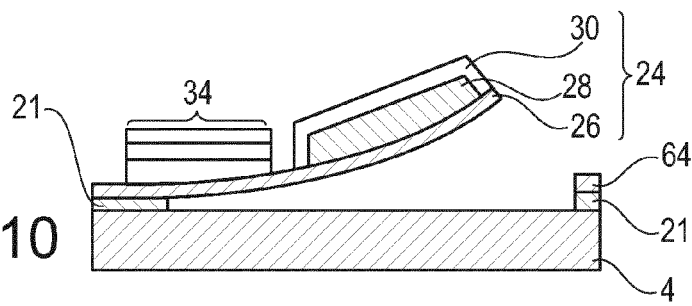

In a step 76, the layers 64 and 62 are etched, for example by chemical etching, to form the layer 26 and release the element 24 (see FIG. 10). When the layer 62 located under the layer 64 is eliminated, the element 24 moves under the effect of the stress exerted by the layer 28 to its top position.

Finally, in a step 78, the hood forming the walls 12 to 14 is attached to the substrate 4 to delimit the recess 10. The heat source 18 can be fastened onto this hood before or after the latter is attached to the substrate 4.

Thus, at the end of this method, the device 2 represented in FIG. 1 is obtained.

Figure 11:
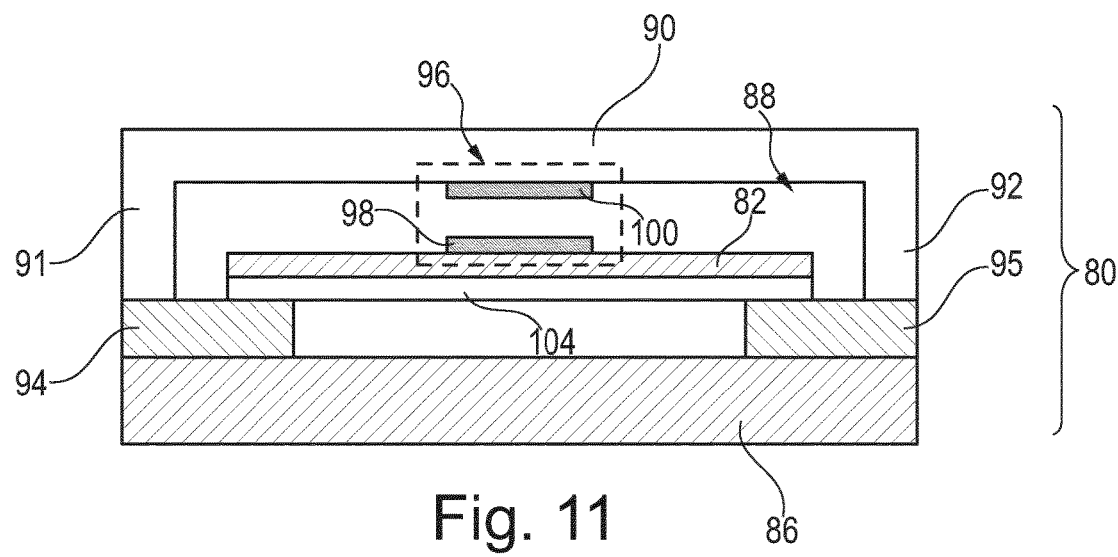
FIG. 11 is a schematic illustration of a device for compensating for a temperature variation.

FIG. 11 represents a device 80 including a temperature-compensated oscillating suspended element 82 employing a transformation from a use temperature variation $\Delta T_1$ into a desired temperature variation $\Delta T_2$ in the opposite direction. Here, the use temperature is the ambient temperature. For example, the device 80 is an oscillator or an accelerometer. As previously described, this device 80 is preferably fabricated using the same methods as those used in microelectronics. Typically, it is made by stacking and etching a series of layers on a horizontal substrate 86. Here, this substrate 86 is made of a material having a thermal expansion coefficient $\lambda_1$. For example, the material of the substrate 86 is silicon.

A recess 88 is fashioned inside the device 80. A suspended element 82 is housed inside this recess 88. The recess 88 is delimited by an upper horizontal wall 90, a lower horizontal wall and vertical walls 91 and 92. The lower horizontal wall is formed by the substrate 86. The walls 90 to 92 are those of a hood, for example attached to the substrate 86. Typically, a vacuum is made inside the recess 88 to allow the oscillation of the suspended element 82.

In this embodiment, the element 82 is a cantilever that runs horizontally between its ends. These ends each rest on a shim, 94 and 95 respectively. For example, the shims 94 and 95 are made of oxide such as silicon oxide. These shims 94 and 95 are fastened with no degree of freedom onto the substrate 86. Thus, the central part of the element 82 located between its ends is suspended above the substrate 86 and can move vertically.

Here, the element 82 is made of a material having a thermal expansion coefficient $\lambda_2$.

In these conditions, as for the device 2, under the action of a temperature variation $\Delta T_1$, the element 82 deforms between a contracted position and an expanded position. For example, the materials of the element 82 and of the substrate 84 are chosen such that the coefficient $\lambda_2$ is less than the thermal expansion coefficient $\lambda_1$. In these conditions, if the temperature increases, the substrate 86 exerts a stress on the element 82 that tends to stretch it.

The device 80 also includes an actuator 96 able to make the element 82 oscillate between two states named top and bottom, respectively. In the top state, the central part of the element 84 is curved toward the top and therefore approaches the upper wall 90. In the bottom state, the central part is curved toward the bottom and therefore approaches the substrate 86.

In FIG. 11, the element 82 is represented in an intermediate state between the top and bottom states in which the element 82 extends horizontally.

For example, the actuator 96 is an electrostatic actuator. For this purpose, it includes an electrode 98 fastened with no degree of freedom onto the element 82 and another electrode 100 fastened with no degree of freedom facing the electrode 98 on the wall 90. To simplify FIG. 11, the electrical connections between these electrodes 98 and 100 and the outside of the recess 88 have not been represented.

Finally, the device 80 includes an elastocaloric material layer 104 deposited along the element 82 to undergo the mechanical stresses caused by the expansion of the substrate 86 in response to the temperature variation $\Delta T_1$. Here, layer 104 runs continuously and directly along the element 88 between its two ends to exchange heat by thermal conduction with element 82. The layer 104 is located beneath the layer 82. It is therefore interposed between the ends of the element 82 and the shims 94 and 95.

The elastocaloric material of the layer 104 is such that, when it is stretched in its horizontal direction, its internal temperature decreases. Preferably, the chosen elastocaloric material makes it possible to obtain a temperature variation $\Delta T_2$ equal to within plus or minus 25% and, preferably, to within plus or minus 10 or 5% to the opposite of the variation $\Delta T_1$ causing the deformation of the element 82 between its contracted and expanded positions. As previously described, the elastocaloric material and the arrangement of the element 82 are determined experimentally from:
- charts giving the variation of the internal temperature of the layer 104 as a function of the variation in the applied mechanical stress, and
- numerical simulations giving the variation in the stress applied to the layer 104 as a function of the arrangement of the element 82.

For example, the given variation $\Delta\sigma$ in the mechanical stress applied to the layer 104 is computed by numerical simulation for a given variation $\Delta T_1$ of the ambient temperature. Typically, a given variation $\Delta T_1$ greater than 10° C. is chosen. Next, an elastocaloric material is sought with a temperature that varies by $\Delta T_2$ in response to the given variation $\Delta\sigma$ in the applied stress, where $\Delta T_2$ is equal to $-\Delta T_1$ to within plus or minus 25% or 10% and, preferably, to within plus or minus 5%. If this is so, this material is selected for producing the layer 104. If no elastocaloric material with the desired temperature variation $\Delta T_2$ can be found, then the geometry or the material of the element 82 is modified to modify the computed value of the given stress $\Delta\sigma$. Next, the preceding steps are repeated until an arrangement of the element 82 corresponds to an existing elastocaloric material to produce the layer 104.

The operation of the device 80 is as follows. The actuator 96 is powered with an alternating-current voltage, which causes the element 82 to oscillate between its top and bottom states at a given frequency. Each deformation of the element 82 toward the top or bottom state incurs a deformation of the layer 104 and therefore the appearance of a mechanical stress in this layer. Each stress variation undergone by the layer 104 is transformed into a variation of its internal temperature. However, these modifications of the internal temperature of the layer 104 do not modify, or modify only negligibly, the temperature of the element 82. Indeed, the stresses undergone by the layer 104 caused by the oscillations of the element 82 are alternately in one direction, then the opposite direction. Thus, the temperature of the layer 104 oscillates between two temperatures with the same oscillation frequency as that of the element 82. Because of the thermal inertia of the material forming the element 82 the temperature variations in one direction and in the opposite direction caused by the thermal conduction with the layer 104 cancel out inside the element 82. Thus, the oscillations of the element 82 do not provoke an oscillation in its temperature, or simply provoke an oscillation in temperature of very low amplitude, i.e. for example of less than 5 or 1° C. Hence, the temperature of the element 82 is substantially equal to the ambient temperature of the medium in which it is immersed.

If the ambient temperature increases, the temperature of the various elements of the device 80 also increases. For example, here, it is supposed that the temperature increases by 10° C. This temperature variation, denoted $\Delta T_1$, triggers an expansion of the substrate 86 in response. The element 82 expands less than the substrate 86. Hence, the given mechanical stress $\Delta \sigma$ that stretches the element 82 appears. This stress is liable to modify the oscillation frequency of the element 82 if nothing is done.

However, here, this stress $\Delta \sigma$ is also exerted on the layer 104. In response, the internal temperature of the layer 104 decreases by $\Delta T_2$. This variation $\Delta T_2$ of the temperature of the layer 104 is transmitted by thermal conduction to the element 82, which reduces and preferably cancels the temperature variation $\Delta T_1$. Thus, the oscillation frequency of the element 82 is made less sensitive to temperature variations.

Figure 12:
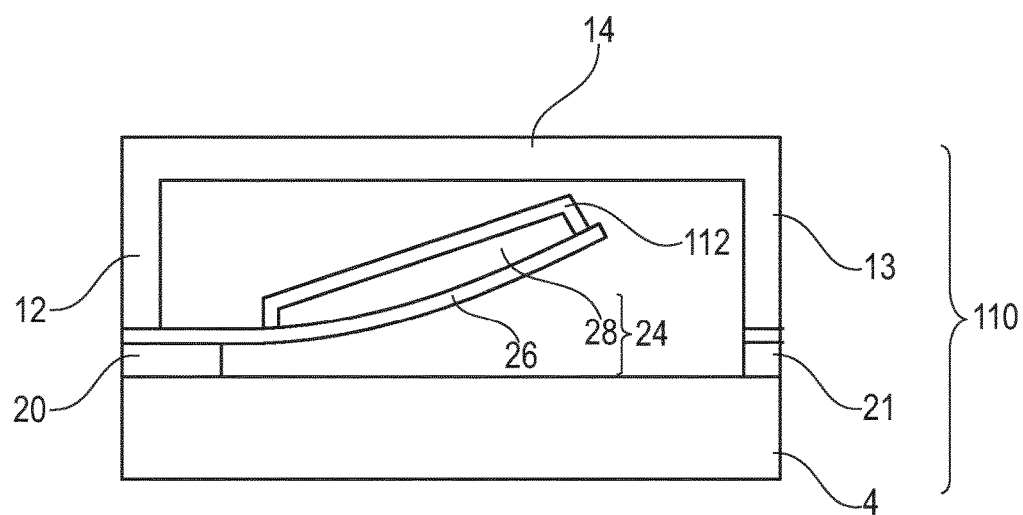
FIG. 12 is a schematic illustration of a device for amplifying a temperature variation.

FIG. 12 represents a device 110 for amplifying a temperature variation $\Delta T_1$. In this device 110, a desired temperature variation $\Delta T_2$ is generated to be added to the temperature variation $\Delta T_1$. The device 110 is for example identical to the device 2 except that the transducer 34 is omitted and the layer 30 is replaced by a layer 112. The layer 112 is identical to the layer 30 except that it is made of an elastocaloric material whose temperature increases when the element 24 moves from its top position to its bottom position.

The device 110 does not use the heat source 18.

The operation of the device 110 is as follows. When the ambient temperature of the medium into which the device 110 is plunged increases, this produces the variation $\Delta T_1$ of the temperature of the element 24. In response, the element 24 deforms from its top position to its bottom position. The layer 112 then transforms the corresponding stress variation into the desired variation $\Delta T_2$ of its internal temperature. The temperature variations $\Delta T_1$ and $\Delta T_2$ accumulate, for example inside the element 24 or the layer 112, so that the temperature attained by the element 24 and the layer 112 is greater than the ambient temperature. This device therefore makes it possible to amplify the temperature variation $\Delta T_1$.

Many other embodiments are possible. For example, the piezoelectric material of the transducer 34 can be PZT, AlN or others.

The transducer 34 can also operate using a different physical principle. For example, it can be replaced by a capacitive or magnetic transducer capable of converting the mechanical energy of the deformations of the suspended element into electrical energy. By way of illustration, a capacitive transducer is produced by fastening an electrode onto the element 24 and another electrode, facing it, onto the substrate 4. The variation in capacitance between these two electrodes is then converted into electrical energy.

The element 24 can be fastened elsewhere. For example, it can be fastened directly onto the wall 14 or onto the cold wall 16.

The device 2 can also be easily adapted for operating in the case where a negative temperature gradient is created between the ambient temperature and a cold point. For example, the source 18 is replaced by a cold point whose temperature becomes less than the ambient temperature of the medium in which the device 2 is sunk when this source is activated. In this case, the suspended element is adapted to deform from the top point to the bottom point in response to a drop in temperature. Moreover, the elastocaloric material of the layer 30 is replaced by an elastocaloric material whose temperature increases when the suspended element moves from its top position to its bottom position.

In a variant, in the absence of temperature gradient, the position of the suspended element 24 is closer to the cold wall than to the hot wall. In this case, to operate, the suspended element is adapted to move from its bottom position to its top position in response to an increase $\Delta T_1$ in temperature. In this embodiment, the temperature of the elastocaloric material increases when the suspended elastocaloric material deforms from its bottom position to its top position.

In a variant, the layer 26 is made of an elastocaloric material and the layer 30 is omitted. In this case, the bimetallic strip is formed by the juxtaposition of the layer 28 and of the elastocaloric material layer.

Other technical means can be used to make the suspended element deform from its top position to its bottom position in response to a temperature variation. For example, the suspended element is a cantilever anchored at both ends with no degree of freedom onto a substrate 4 having a different thermal expansion coefficient. In this case, it is not necessary for the suspended element to be a bimetallic strip.

For the device 80, other actuators 96 are possible to make the element 82 oscillate. For example, the actuator 96 is replaced by a piezoelectric or magnetic actuator.

An additional elastocaloric material layer, for example identical to the layer 104, can be deposited on the element 82 on the side opposite the layer 104. When this additional layer is used, the layer 104 interposed between the element 82 and the substrate 86 can be omitted.

The expansion coefficient $\lambda_1$ is not necessarily greater than the expansion coefficient $\lambda_2$. In a variant, the reverse is also possible. In this case, when the temperature increases, the elastocaloric material layer is compressed. It is therefore necessary to use an elastocaloric material whose temperature decreases when the material is compressed. Another solution consists in keeping the same elastocaloric material but in using a mechanical assembly of the suspended element ensuring that the latter undergoes traction when the temperature increases. Finally, in another embodiment, it is not necessary for the expansion coefficients of the materials used to make the element 82 and the substrate 86 to be different. They can also be equal. In this case, the differential in expansion of these elements is provoked by the fact that these elements are not heated to the same temperature.

Whatever the embodiment previously described, the elastocaloric material layer can be found just as well on the upper side as the underside, and on both sides or one side at a time.

The elastocaloric material layer can of course be single-layer or multi-layer.

In other embodiments, the suspended element can deform in a direction parallel to the plane of the substrate rather than in a direction perpendicular to the plane of the substrate. In this case, the elastocaloric material layer is found at least on one of the vertical faces of this suspended element.

The elastocaloric material layer can cover a part of the suspended element only. For example, the elastocaloric material layer can be arranged solely at the places where the maximum mechanical stresses are undergone.

Conversely, the suspended element can be deposited only at certain discontinuous places along the elastocaloric material layer.

The devices previously described can also be fabricated using other technologies and, in particular, using the same fabrication methods as those used to fabricate macroscopic devices. Thus, in the latter case, the fabricated devices are neither NEMS (Nanoelectromechanical systems) nor MEMS but devices on the macroscopic scale, i.e. whose largest dimension is greater than at least 1 cm, and preferably greater than 5 cm or 10 cm.

The suspended element is not necessarily a cantilever anchored in a substrate at one or two of its ends. For example, the suspended element can also be formed from a membrane the whole periphery of which is anchored on the substrate so as to leave its central part free to deform.

The suspended element can be made from a single block of material or, on the contrary, by a stack of several layers of different materials.

The recesses of the previously described devices can be produced in a different way not involving the attachment of a hood. For example, they can be directly hollowed out into the substrate.

The devices previously described are typically intended to be incorporated into larger components such as a sensor, a microsystem, a resonator, an oscillator or an actuator.

The invention claimed is:

1. A device for generating a second temperature variation $\Delta T_2$ from a first use temperature variation $\Delta T_1$, comprising:
    an elastocaloric material layer having an internal temperature of which is able to vary by $\Delta T_2$ in response to a given mechanical stress variation $\Delta\sigma$ applied to the elastocaloric material layer, the given variation $\Delta\sigma$ being induced by the first use temperature variation $\Delta T_1$,
    a suspended element in mechanical contact with the elastocaloric material layer so as to apply to this layer a mechanical stress that varies in response to the use temperature variation $\Delta T_1$,
    wherein the suspended element is arranged so as to make the mechanical stress applied to the elastocaloric material layer vary by $\Delta\sigma$ in response to the temperature variation $\Delta T_1$, to generate the second temperature variation $\Delta T_2$.

2. The device as claimed in claim 1, wherein the internal temperature of the elastocaloric material is capable of varying by at least 1° C. in response to the given mechanical stress variation $\Delta\sigma$ and the suspended element is formed so as to make the mechanical stress applied to the elastocaloric material layer vary by at least $\Delta\sigma$ MPa in response to the use temperature variation $\Delta T_1$.

3. The device as claimed in claim 2, wherein the variation $\Delta T_1$ is greater than 10° C.

4. The device as claimed in claim 3, wherein the variation $\Delta\sigma$ in response to the variation $\Delta T_1$ is of at least 1 MPa.

5. The device as claimed in claim 1 for generating electricity, wherein:
    the device includes a recess delimited by, on one side, a hot wall to dissipate heat inside the recess and, on the opposite side, a cold wall having a lower temperature than the hot wall,
    the suspended element is arranged inside the recess between the hot and cold walls, the suspended element being capable of deforming between a position closer to the hot wall to a position closer to the cold wall or conversely under the action of the variation $\Delta T_1$ in the temperature of one of these walls,
    the elastocaloric material is capable of transforming the mechanical stress variation that it undergoes when the suspended element deforms into a drop $\Delta T_2$ in its internal temperature if the suspended element deforms from its closest position to the hot wall to its closest position to the cold wall under the action of the variation $\Delta T_1$ or into a rise $\Delta T_2$ in its internal temperature if the suspended element deforms from its closest position to the cold wall to its closest position to the hot wall under the action of the variation $\Delta T_1$, and
    further including a transducer capable of converting the deformation of the suspended element into electrical energy.

6. The device as claimed in claim 5, wherein the suspended element comprises a first and a second layer of material directly fastened one on top of the other with no degree of freedom, each of these layers being made of a material having a different thermal expansion coefficient from the other layer so as to form a bimetallic strip capable of deforming under the action of the temperature variation $\Delta T_1$.

7. The device as claimed in claim 6, wherein one of the first and of the second layers is made of an elastocaloric material to form the elastocaloric material layer and the other of the first and of the second layers is made of material incapable of generating a temperature variation greater than 0.5° C. in response to the mechanical stress variation $\Delta\sigma$ applied to this layer.

8. The device as claimed in claim 1, wherein the device includes an actuator capable of making the suspended element oscillate between two states at a predetermined frequency for a given use temperature, and the elastocaloric material is capable of transforming the mechanical stress variation that it undergoes when the use temperature of the suspended element varies by $\Delta T_1$ into a temperature variation $\Delta T_2$ of opposite direction to the temperature variation $\Delta T_1$.

9. The device as claimed in claim 8, wherein the elastocaloric material is capable of transforming the mechanical stress variation that it undergoes, when the use temperature of the suspended element varies by $\Delta T_1$, into a variation $\Delta T_2$ of its internal temperature, the amplitude of which is equal to the amplitude of the variation $\Delta T_1$ to within plus or minus 25%.

10. The device as claimed in claim 8, wherein:
    the suspended element comprises a first material having a first thermal expansion coefficient and two ends,
    the device further includes a rigid substrate onto which the ends of the suspended element are fastened with no degree of freedom, the substrate being made of a second material having a second thermal expansion coefficient different from the coefficient of the first material so that the use temperature variation $\Delta T_1$ causes the mechanical stress exerted on the suspended element to vary.

11. The device as claimed in claim 8, wherein the elastocaloric material layer is interposed between at least one of said ends of the suspended element and the substrate.

12. The device as claimed in claim 1, wherein the elastocaloric material layer is capable of transforming the stress variation that it undergoes, when the temperature of the suspended element varies by $\Delta T_1$, into a variation $\Delta T_2$ of its internal temperature in the same direction as the first temperature variation $\Delta T_1$.

13. The device as claimed in claim 1, wherein the elastocaloric material is chosen from the group composed of $Cu_{68.13}Zn_{15.74}Al_{16.13}$, nickel and titanium alloys, FeRh alloys, PZT, and ferroelectric polymers.

14. The device as claimed in claim 1, wherein the suspended element runs essentially in a main direction and the elastocaloric material layer covers at least 50% of the suspended element in the main direction.

15. A method for generating a second temperature variation $\Delta T_2$ from a first use temperature variation $\Delta T_1$, this method comprising:
   varying by $\Delta T_1$ of the use temperature of a device including a suspended element, the suspended element being formed so as to make a mechanical stress applied to an elastocaloric material layer in mechanical contact with this suspended element vary by at least $\Delta \sigma$ MPa in response to the use temperature variation $\Delta T_1$, and
   in response, varying by at least $\Delta \sigma$ MPa of the mechanical stress applied by the suspended element to the elastocaloric material layer in mechanical contact with this suspended element, and
   transforming by the elastocaloric material layer, the mechanical stress variation into a variation $\Delta T_2$ of its internal temperature that opposes, or conversely, increases the use temperature variation $\Delta T_1$.

16. The method as claimed in claim 15, wherein the variation $\Delta T_1$ is greater than 10° C.

17. The method as claimed in claim 15, wherein the variation of $\Delta T_2$ is greater than 10° C.

* * * * *